(12) United States Patent
Imai et al.

(10) Patent No.: US 9,995,415 B2
(45) Date of Patent: Jun. 12, 2018

(54) FLUIDIC DEVICE

(71) Applicant: Surpass Industry Co., Ltd., Saitama (JP)

(72) Inventors: Takashi Imai, Saitama (JP); Masahiro Hasunuma, Saitama (JP)

(73) Assignee: Surpass Industry Co., Ltd., Gyoda-shi, Saitama (JP)

( * ) Notice: Subject to any disclaimer, the term of this patent is extended or adjusted under 35 U.S.C. 154(b) by 0 days. days.

(21) Appl. No.: 15/292,662

(22) Filed: Oct. 13, 2016

(65) Prior Publication Data
US 2017/0108149 A1  Apr. 20, 2017

(30) Foreign Application Priority Data

Oct. 16, 2015 (JP) .................................. 2015-204641

(51) Int. Cl.
F16L 9/12 (2006.01)
F16L 57/00 (2006.01)
H05K 9/00 (2006.01)
H01B 1/24 (2006.01)
F16K 31/126 (2006.01)

(52) U.S. Cl.
CPC ............ *F16L 9/125* (2013.01); *F16K 31/126* (2013.01); *F16L 57/00* (2013.01); *H01B 1/24* (2013.01); *H05K 9/0064* (2013.01)

(58) Field of Classification Search
CPC ........ F16L 9/125; F16L 57/00; H05K 9/0064; H01B 1/24; F16K 31/26
See application file for complete search history.

(56) References Cited

U.S. PATENT DOCUMENTS

| | | |
|---|---|---|
| 4,357,748 A | 11/1982 | Branson et al. |
| 4,717,117 A | 1/1988 | Cook |
| 5,494,258 A | 2/1996 | Weissgerber et al. |
| 5,941,501 A | 8/1999 | Biegelsen et al. |
| 6,382,588 B1 | 5/2002 | Hierold |
| 8,002,894 B2 | 8/2011 | Higashijima et al. |
| 2001/0052366 A1 | 12/2001 | Ozawa |
| 2003/0021929 A1 | 1/2003 | Takahashi et al. |
| 2004/0004199 A1 | 1/2004 | Igarashi |
| 2005/0285064 A1 | 12/2005 | Yoshino et al. |
| 2006/0060004 A1 | 3/2006 | Desrochers et al. |

(Continued)

FOREIGN PATENT DOCUMENTS

| | | |
|---|---|---|
| JP | S 63-155231 U | 10/1988 |
| JP | H 06-341561 A | 12/1994 |

(Continued)

OTHER PUBLICATIONS

Extended European Search Report dated Jul. 19, 2017.
(Continued)

*Primary Examiner* — Michael C Miggins
(74) *Attorney, Agent, or Firm* — Muncy, Geissler, Olds & Lowe, P.C.

(57) ABSTRACT

There is provided a flow rate adjustment apparatus including a main body inside which a fluid flow passage that guides a fluid has been formed, in which the main body is formed of a conductive fluorine resin material containing a fluorine resin material, and a carbon nanotube dispersed in the fluorine resin material, and in which a volume resistivity of the conductive fluorine resin material is more than $1.0 \times 10^3$ $\Omega \cdot cm$ and less than $1.0 \times 10^4$ $\Omega \cdot cm$.

10 Claims, 6 Drawing Sheets

(56) References Cited

U.S. PATENT DOCUMENTS

| | | |
|---|---|---|
| 2007/0215224 A1 | 9/2007 | Furukawa et al. |
| 2009/0267346 A1 | 10/2009 | Hasunuma |
| 2013/0207010 A1 | 8/2013 | Hirai et al. |
| 2014/0231682 A1 | 8/2014 | Hirai |
| 2015/0028243 A1 | 1/2015 | Bernhart et al. |
| 2015/0123394 A1 | 5/2015 | Breay et al. |
| 2015/0129791 A1 | 5/2015 | Okita et al. |
| 2015/0345660 A1 | 12/2015 | Kho |

FOREIGN PATENT DOCUMENTS

| | | |
|---|---|---|
| JP | H 09-196199 A | 7/1997 |
| JP | 2003-4176 A | 1/2003 |
| JP | 2004-36765 A | 2/2004 |
| JP | 2008-545990 A | 12/2008 |
| JP | 2009-024749 A | 2/2009 |
| JP | 2010-121689 A | 6/2010 |
| JP | 2015-021618 | 2/2015 |
| JP | 2015-110732 A | 6/2015 |
| JP | 3198694 U | 7/2015 |
| WO | WO 2007/066791 A1 | 6/2007 |

OTHER PUBLICATIONS

Extended European Search Report for European Application No. 16193143.1 dated Mar. 8, 2017.
U.S. Office Action for Related U.S. Appl. No. 15/426,233 dated Jan. 12, 2018.

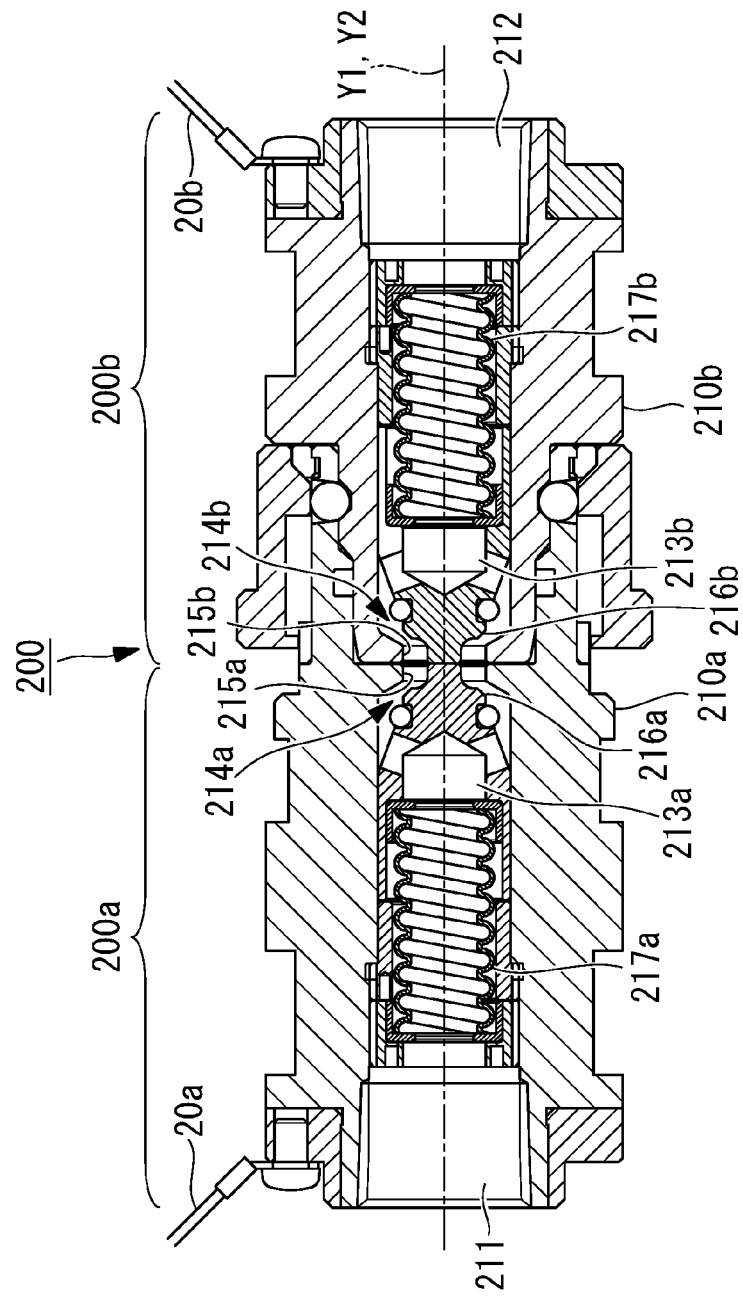

FLUIDIC DEVICE

CROSS-REFERENCE TO RELATED APPLICATIONS

This application is based on Japanese Patent Application No. 2015-204641, the contents of which are incorporated herein by reference in its entirety.

TECHNICAL FIELD

The present disclosure relates to fluidic device whose main body is formed of a conductive resin material.

BACKGROUND ART

Since a fluorine resin material is superior in chemical resistance and contamination resistance, it is widely used for fluidic device that makes flow a corrosive fluid, pure water, etc. used for manufacturing semiconductors.

Meanwhile, the fluorine resin material has a volume resistivity greater than $10^{18}$ Ω·cm, and is generally classified into insulating materials. Therefore, inside fluidic device formed of the fluorine resin material, there may be generated electrostatic charge due to friction between a fluid flow passage formed inside the fluidic device and a fluid.

In order to prevent generation of electrostatic charge, it can be considered that a conductive substance, such as carbon black and iron powder, is mixed with the fluorine resin material to thereby give conductivity to the fluorine resin material. However, metal ions might elute from the conductive substance by contact between the conductive substance and the fluid, and thereby the fluid might be contaminated.

Consequently, there has been known an antistatic fluorine resin tube in which a conductive portion including a fluorine resin composition containing a conductive substance has been embedded in stripes in an outer peripheral surface of the antistatic fluorine resin tube to thereby give conductivity thereto (for example, refer to Japanese Unexamined Patent Application, Publication No. 2003-4176). Since the conductive substance and the fluid do not come into contact with each other in the antistatic fluorine resin tube disclosed in Japanese Unexamined Patent Application, Publication No. 2003-4176, the fluid is not contaminated by elution of the metal ions from the conductive substance.

SUMMARY

Technical Problem

However, in the antistatic fluorine resin tube disclosed in Japanese Unexamined Patent Application, Publication No. 2003-4176, conductivity is not given to an inner peripheral surface of the fluid flow passage in which electrostatic charge is easily generated by friction with the fluid. Therefore, electrostatic charge generated at the inner peripheral surface of the fluid flow passage cannot reliably removed, and dielectric breakdown of a resin material that forms the fluid flow passage might occur by excessive electrostatic charge of static electricity.

The present disclosure has been made in view of such circumstances, and an object thereof is to provide fluidic device in which electrostatic charge due to friction between a fluid flow passage and a fluid, and contamination of the fluid due to contact between the fluid flow passage and the fluid have been suppressed.

Solution to Problem

The present disclosure employs the following solutions in order to solve the above-described problems.

Fluidic device according to one aspect of the present disclosure includes a main body inside which a fluid flow passage that guides a fluid has been formed. Additionally, in the above-described fluidic device, the main body is formed of a conductive fluorine resin material containing a fluorine resin material, and a carbon nanotube dispersed in the fluorine resin material, and a volume resistivity of the conductive fluorine resin material is more than $1.0 \times 10^3$ Ω·cm and less than $1.0 \times 10^4$ Ω·cm.

According to the fluidic device according to one aspect of the present disclosure, the volume resistivity of the conductive fluorine resin material that forms the fluid flow passage directly coming into contact with the fluid is more than $1.0 \times 10^3$ Ω·cm and less than $1.0 \times 10^4$ Ω·cm. By configuring the fluidic device as described above, the volume resistivity of the conductive fluorine resin material is set to be a value large enough to suppress electrostatic charge due to friction between the fluid flow passage and the fluid, and electrostatic charge can be suppressed from being generated in the main body.

The fluidic device according to one aspect of the present disclosure may be configured such that the conductive fluorine resin material contains the carbon nanotube at a rate not less than 0.020 weight % and not more than 0.030 weight %.

According to the fluidic device of the configuration, the rate of the carbon nanotube contained in the conductive fluorine resin material that forms the fluid flow passage directly coming into contact with the fluid is a slight one not less than 0.020 weight % and not more than 0.030 weight %. Even though the rate of the carbon nanotube is the slight one as described above, constant conductivity can be given to the main body to thereby suppress electrostatic charge by dispersing the carbon nanotube not less than 0.020 weight % into the fluorine resin material. This is because a smaller amount of carbon nanotube can give conductivity to the main body as compared with other granular conductive substances, such as carbon black and iron powder by using as the conductive substance the tubular carbon nanotube having a predetermined length.

In addition, according to the fluidic device of the configuration, since the rate of the carbon nanotube contained in the conductive fluorine resin material is the slight one not more than 0.030 weight %, contamination of the fluid due to contact between the fluid flow passage and the fluid can be suppressed unlike the other granular conductive substances, such as carbon black and iron powder.

As described above, according to the fluidic device of the configuration, there can be provided the fluidic device in which electrostatic charge due to the friction between the fluid flow passage and the fluid, and contamination of the fluid due to the contact between the fluid flow passage and the fluid have been suppressed.

The fluidic device according to one aspect of the present disclosure may include a diameter reduction part that is arranged in the fluid flow passage, and locally decreases a flow passage cross-sectional area of the fluid flow passage.

By configuring the fluidic device as described above, in the fluidic device including the diameter reduction part in which electrostatic charge due to the friction between the fluid flow passage and the fluid is particularly easily generated, electrostatic charge in the main body adjacent to the diameter reduction part can be suppressed.

The fluidic device according to one aspect of the present disclosure may include a metal conduction member that is attached in a state of being in contact with the main body, and that is connectable to a ground cable maintained to have a ground potential.

By configuring the fluidic device as described above, the conductive fluorine resin material is connected to the ground cable through the conduction member to thereby have a potential close to the ground potential, and electrostatic charge is reliably suppressed from being generated by the friction between the fluid flow passage and the fluid.

The fluidic device according to one aspect of the present disclosure may be configured such that the fluid flow passage has: an upstream-side flow passage that is communicated with an inflow port; and a downstream-side flow passage that is communicated with an outflow port, the fluidic device includes: a valve chamber that is communicated with the upstream-side flow passage and the downstream-side flow passage; and a valve body part that is inserted into a valve hole that guides the fluid from the upstream-side flow passage to the valve chamber, and such that the diameter reduction part is a gap that is formed between the valve hole and the valve body part.

According to the configuration, in the fluidic device that adjusts a flow rate of the fluid flowing through the fluid flow passage by an insertion amount of the valve body part into the valve hole, electrostatic charge is suppressed from being generated by the friction between the fluid flow passage and the fluid near the gap that is formed between the valve hole and the valve body part.

The fluidic device of the above-described configuration may have a mode including: a biasing force generation part that generates a biasing force in a direction in which the valve body part is brought into contact with the valve hole along an axis line of the valve body part; a diaphragm part that is coupled to an end of the valve body part inserted into the valve chamber, and has a thin film part annularly formed around the axis line; and an opposing force generation part that generates an opposing force in a direction in which the valve body part is separated from the valve hole along the axis line of the valve body part through the diaphragm part.

According to the mode, in the fluidic device including the diaphragm part having the thin film part that is particularly easily broken by dielectric breakdown, electrostatic charge is suppressed from being generated by the friction between the fluid flow passage and the fluid, and the thin film part can be prevented from being broken by dielectric breakdown.

In the fluidic device of the above-described mode, the biasing force generation part is a metal spring, and the fluidic device may include an antistatic member that electrically connects the spring and the main body.

By configuring the fluidic device as described above, since the metal spring is maintained to have the same potential as the main body that is formed of the conductive fluorine resin material, the metal spring can be prevented from being excessively charged to cause dielectric breakdown therearound.

In the fluidic device according to one aspect of the present disclosure, the fluid flow passage has: an upstream-side flow passage that is communicated with an inflow port; and a downstream-side flow passage that is communicated with an outflow port, and the main body has: a first main body inside which the upstream-side flow passage has been formed; and a second main body inside which the downstream-side flow passage has been formed. Additionally, the above-described fluidic device includes: a first valve hole that is formed in the first main body, and guides to the second main body the fluid having flowed in from the inflow port; a first valve body part that is housed in the first main body, and is inserted into the first valve hole; a first biasing force generation part that generates a first biasing force in a direction in which the first valve body part is brought into contact with the first valve hole along a first axis line of the first valve body part; a second valve hole that is formed in the second main body, and guides to the downstream-side flow passage the fluid made to flow out from the outflow port; a second valve body part that is housed in the second main body, and is inserted into the second valve hole; and a second biasing force generation part that generates a second biasing force in a direction in which the second valve body part is brought into contact with the second valve hole along a second axis line of the second valve body part. Further, in the above-described fluidic device, the diameter reduction parts may be a first gap that is formed between the first valve hole and the first valve body part, and a second gap that is formed between the second valve hole and the second valve body part.

By configuring the fluidic device as described above, in the fluidic device that couples the first main body and the second main body, and makes the fluid flow from the upstream-side flow passage of the first main body to the downstream-side flow passage of the second main body, electrostatic charge is suppressed from being generated by friction between the upstream-side flow passage and the fluid near the first gap that is formed between the first valve hole and the first valve body part. Similarly, electrostatic charge is suppressed from being generated by friction between the downstream-side flow passage and the fluid near the second gap that is formed between the second valve hole and the second valve body part.

Advantageous Effects

According to the present disclosure, there can be provided the fluidic device in which electrostatic charge due to the friction between the fluid flow passage and the fluid, and contamination of the fluid due to the contact between the fluid flow passage and the fluid have been suppressed.

BRIEF DESCRIPTION OF DRAWINGS

FIG. 6 is a longitudinal cross-sectional view showing one embodiment of the coupling device in a state where the plug device and the socket device are coupled to each other.

DESCRIPTION OF EMBODIMENTS

First Embodiment

Hereinafter, a flow rate adjustment apparatus 100, which is a first embodiment of fluidic device according to the present disclosure, will be explained with reference to drawings. The flow rate adjustment apparatus 100 of the embodiment is fluidic device that is installed in a piping through which a fluid (a liquid, such as a chemical liquid and pure water) used for semiconductor manufacturing apparatuses etc. is made to flow.

Figure 1:
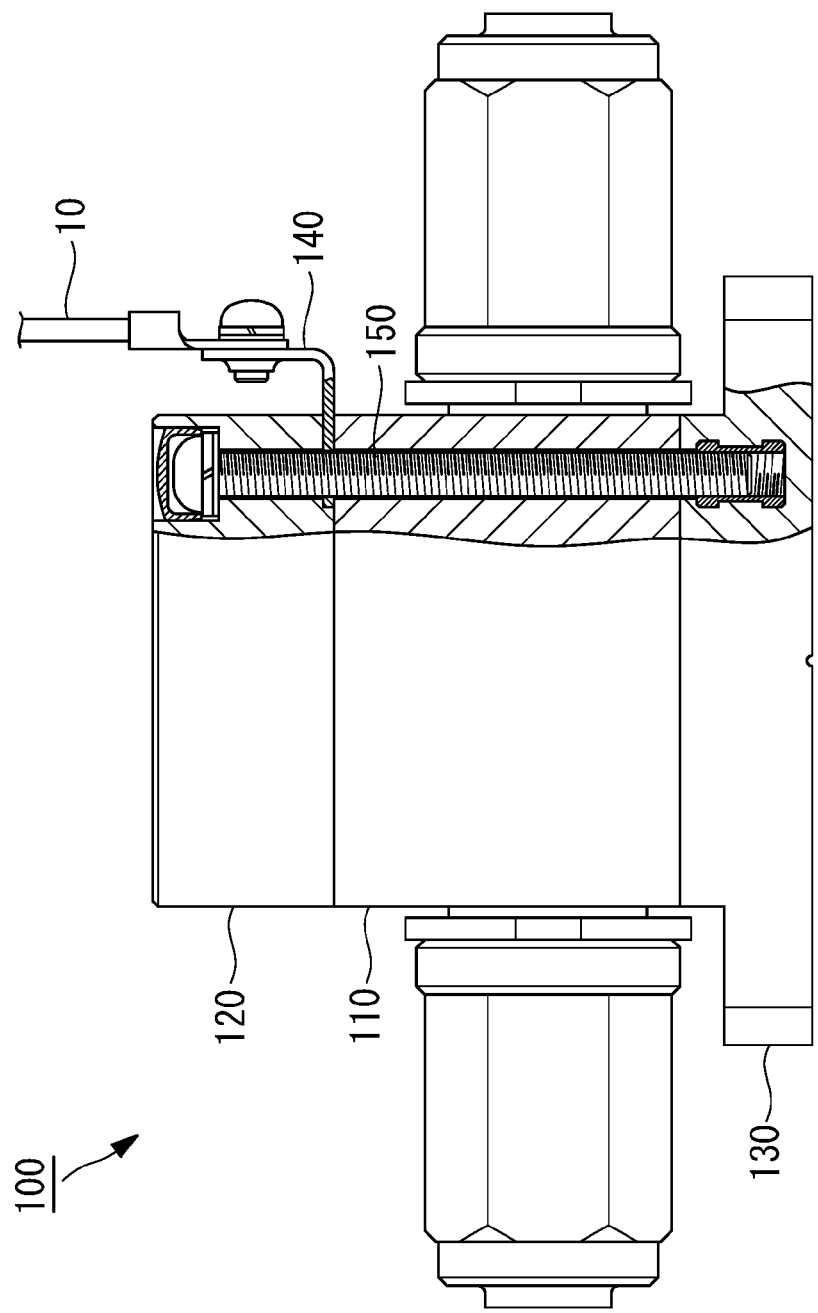
FIG. 1 is an elevational view showing one embodiment of a flow rate adjustment apparatus.
Figure 2:
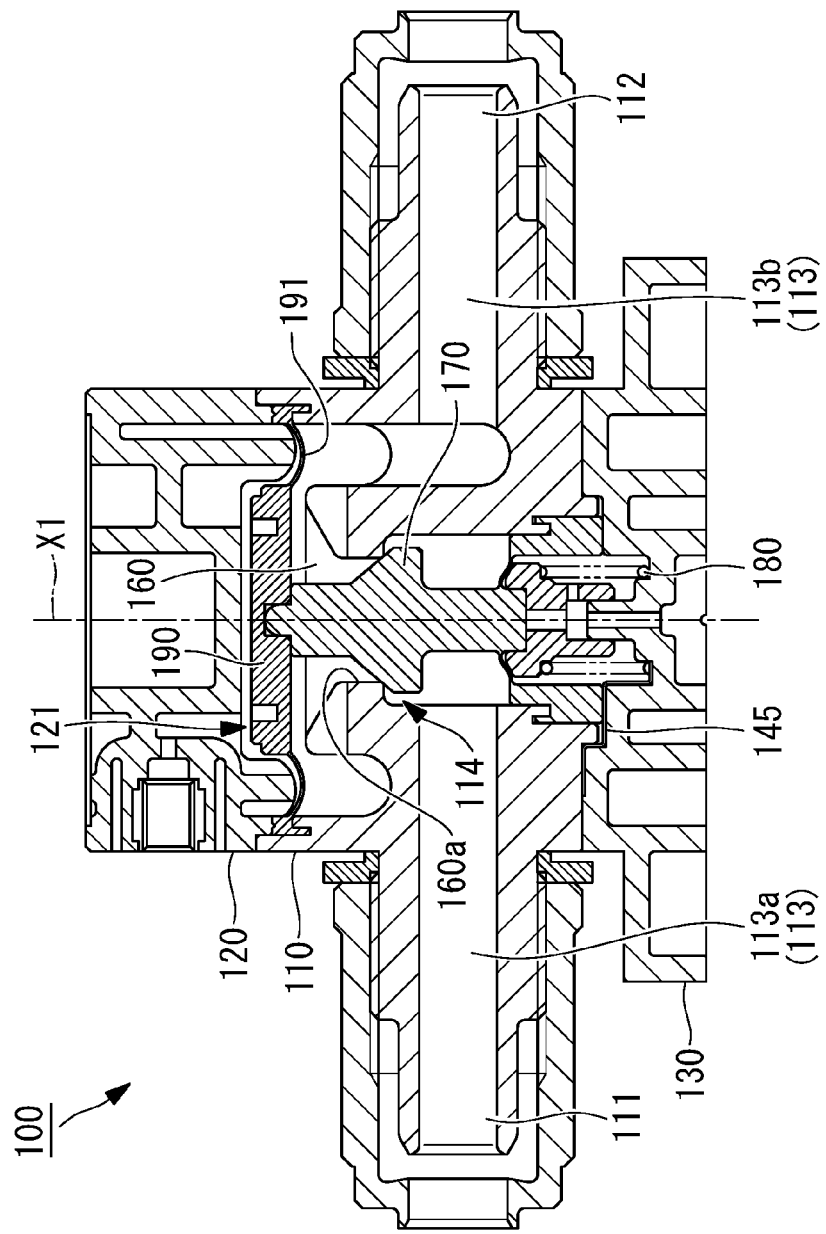
FIG. 2 is a longitudinal cross-sectional view of the flow rate adjustment apparatus shown in FIG. 1.

As shown in an elevational view of FIG. 1, and a longitudinal cross-sectional view of FIG. 2, the flow rate adjustment apparatus 100 includes: a main body 110; an upper housing 120; a lower housing 130; a conduction member 140; an antistatic member 145; a fastening bolt 150; a valve body part 170; a spring (a biasing force generation part) 180; and a diaphragm part 190.

Hereinafter, each configuration included in the flow rate adjustment apparatus 100 will be explained.

The main body 110 is a member inside which a fluid flow passage 113 that guides a fluid from an inflow port 111 to an outflow port 112 has been formed. As will be mentioned later, the main body 110 is formed of a conductive fluorine resin material containing a fluorine resin material, and a carbon nanotube dispersed in the fluorine resin material.

The fluid flow passage 113 that is formed inside the main body 110 has: an upstream-side flow passage 113a that is communicated with the inflow port 111 to which the fluid is guided from an upstream-side piping (illustration is omitted); and a downstream-side flow passage 113b that is communicated with the outflow port 112 that guides the fluid to a downstream-side piping (illustration is omitted).

The upper housing 120 is a member that is arranged above the main body 110, and that houses the diaphragm part 190 in a space formed between the main body 110 and the upper housing 120.

The lower housing 130 is a member that is arranged below the main body 110, and that houses the valve body part 170 in a space formed between the main body 110 and the lower housing 130.

As shown in FIG. 1, the main body 110, the upper housing 120, and the lower housing 130 are integrated by fastening the upper housing 120 and the lower housing 130 by means of the fastening bolt 150 in a state of sandwiching the main body 110.

The conduction member 140 is a metal member that is attached between the main body 110 and the upper housing 120 in a state of being in contact with the main body 110. The conduction member 140 is connectable to a ground cable 10 maintained to have a ground potential.

The antistatic member 145 is the member for preventing occurrence of excessive electrostatic charge in the spring 180 by electrically connecting the metal spring 180, which will be mentioned later, and the main body 110 to which conductivity has been given.

As shown in FIG. 2, the valve body part 170 is a member that is formed in a shaft shape along an axis line X1, and that is inserted into a valve hole 160a that guides the fluid from the upstream-side flow passage 113a to a valve chamber 160. Here, the valve chamber 160 is a space that is communicated with the upstream-side flow passage 113a and the downstream-side flow passage 113b, and that is formed between the main body 110 and a lower surface of the diaphragm part 190.

The spring 180 is a metal member that generates a biasing force in a direction in which the valve body part 170 is brought into contact with the valve hole 160a along the axis line X1 of the valve body part 170.

The diaphragm part 190 is a member that is coupled to an upper end of the valve body part 170 having inserted into the valve chamber 160, and that has a thin film part 191 annularly formed around the axis X1.

As shown in FIG. 2, the diaphragm part 190 is the member that is arranged between the main body 110 and the upper housing 120 in a state of being sandwiched therebetween. In the diaphragm part 190, the valve chamber 160 is formed between the lower surface of the diaphragm part 190 and an upper surface of the main body 110, and a pressure chamber (an opposing force generation part) 121 is formed between an upper surface of the diaphragm part 190 and the upper housing 120.

The pressure chamber 121 serves as a space into which a compressed air is introduced from an external compressed air supply source (illustration is omitted) through an air introduction part 122. The pressure chamber 121 generates by the introduced compressed air an opposing force in a direction in which the valve body part 170 is separated from the valve hole 160a along the axis line X1 of the valve body part 170 through the diaphragm part 190.

The flow rate adjustment apparatus 100 adjusts a cross-sectional area of a gap 114 that is formed between the valve hole 160a and the valve body part 170 by adjusting the opposing force generated by the pressure chamber 121. A flow rate of the fluid that flows through the fluid flow passage 113 increases when the cross-sectional area of the gap 114 becomes large, and it decreases when the cross-sectional area of the gap 114 becomes small. The flow rate of the fluid that flows through the fluid flow passage 113 becomes zero in a blocking state where the valve hole 160a and the valve body part 170 are in contact with each other.

The gap 114 serves as a diameter reduction part that is arranged in the fluid flow passage 113, and that locally decreases a flow passage cross-sectional area of the fluid flow passage 113. Therefore, when the cross-sectional area of the gap 114 becomes small, and a flow velocity of the fluid that passes through the gap rises, the flow rate adjustment apparatus 100 becomes a state where electrostatic charge is easily generated in the main body 110 by friction between the main body 110 near the gap 114 and the fluid.

Next, a material that forms the main body 110 will be explained.

As mentioned above, the fluid flow passage 113 is formed inside the main body 110, and electrostatic charge is easily generated in the main body 110 by friction between the fluid that passes through the fluid flow passage 113 and the main body 110. Particularly, electrostatic charge is remarkably easily generated near the gap 114 since the flow velocity of the fluid rises there.

Consequently, in the embodiment, conductivity is given to the main body 110 to bring the conduction member 140 into contact with the main body 110, and thereby electrostatic charge is suppressed from being generated in the main body 110 inside which the fluid flow passage 113 is formed.

The main body 110 of the embodiment is formed of a conductive fluorine resin material containing a fluorine resin material, and a carbon nanotube dispersed in the fluorine resin material.

Meanwhile, other members excluding the main body 110 and the metal conduction member 140, the antistatic member 145, and the spring 180 are formed of a fluorine resin material into which the carbon nanotube is not dispersed.

Here, the fluorine resin material is, for example, PTFE (polytetrafluoroethylene), PCTFE (polychlorotrifluoroethylene), and PFA (tetrafluoroethylene/perfluoroalkylvinylether copolymer).

A powdery material (for example, PTFE G163 manufactured by Asahi Glass) can be used as the fluorine resin material.

In addition, for example, a carbon nanotube having the following characteristics is desirably used as the carbon nanotube in the embodiment.

The carbon nanotube has a fiber length not less than 50 µm and not more than 150 µm.

It has a fiber diameter not less than 5 nm and not more than 20 nm.

It has a bulk density not less than 10 mg/cm$^3$ and not more than 70 mg/cm$^3$.

It has a G/D ratio not less than 0.7 and not more than 2.0.

It has a purity not less than 99.5%.

It is formed in a multilayer (for example, four to twelve layers).

Here, a reason why the fiber length of the carbon nanotube is set to be not less than 50 µm is that even a small amount of carbon nanotube can give sufficient conductivity in a case where it is dispersed in the fluorine resin material.

In addition, the G/D ratio is a value indicating a ratio of a peak of a G-band and a peak of a D-band that appear in a Raman spectrum of the carbon nanotube. The G-band results from a graphite structure, and the D-band results from defect. The G/D ratio indicates a ratio of purity of a crystal to a defect concentration of the carbon nanotube.

Figure 3:
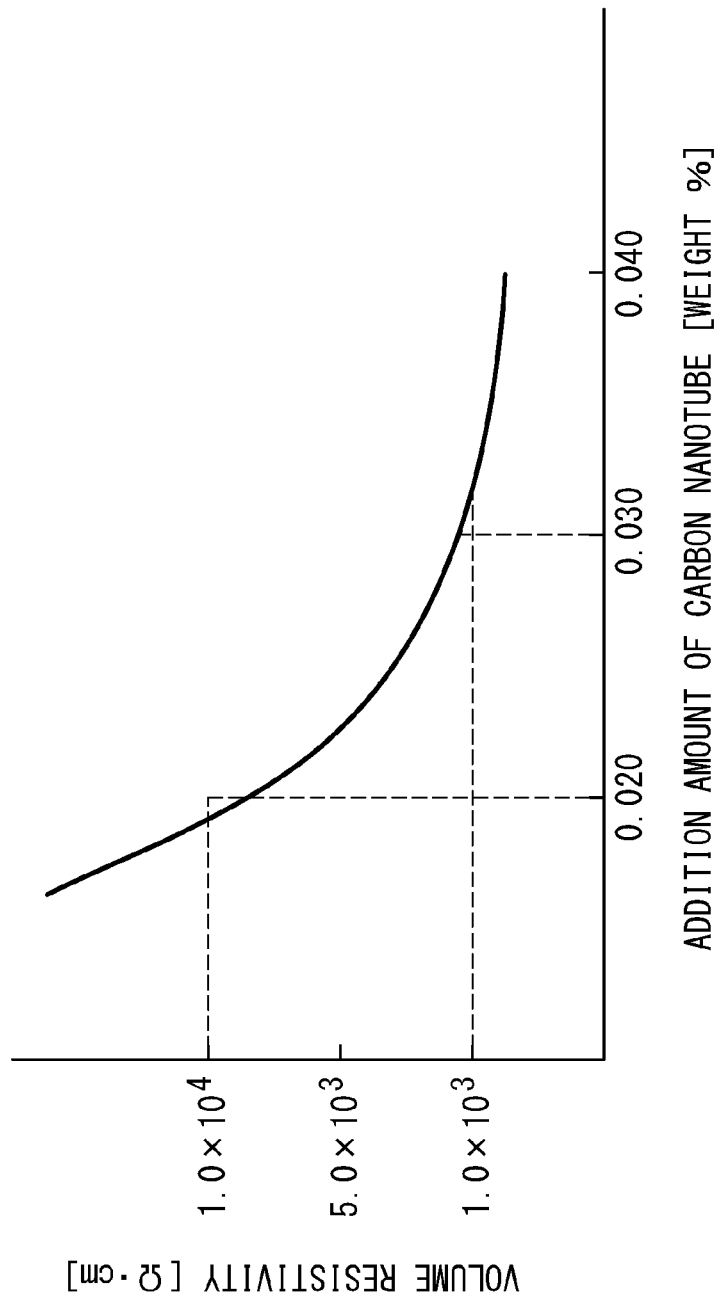
FIG. 3 is a graph showing a relation between an addition amount of a carbon nanotube and a volume resistivity of a conductive fluorine resin material.

The present inventors investigated a relation between an addition amount (weight %) of the carbon nanotube that was dispersed in the fluorine resin material and a volume resistivity (Ω·cm) of the conductive fluorine resin material containing the fluorine resin material and the carbon nanotube dispersed thereinto, and they obtained a result shown in FIG. 3.

The result shown in FIG. 3 is the result of having measured a volume resistivity of a test piece based on "Resistivity test method for conductive plastic by four probe method" specified in JIS K 7194.

As the test piece, a plurality of test pieces were prepared as follows: the test pieces were compression-molded by a compression molding machine after being melt-kneaded by a kneading machine; and the compression-molded test pieces were each processed into a size in conformity with JIS K 7194.

A fluorine resin material used for preparing the test pieces is PTFE G163 manufactured by Asahi Glass.

In addition, a resistivity meter using the four probe method in conformity with JIS K 7194 was used for measuring the volume resistivity. The four probe method is the method that brings four needle-shaped probes (electrodes) into contact with a test piece, and determines a resistance of the test piece from a current passed between the outer two probes, and a potential difference generated between the inner two probes.

The volume resistivity was calculated by averaging measurement values obtained from each of the plurality of test pieces at a plurality of points.

According to the result shown in FIG. 3, the addition amount of the carbon nanotube was set to fall in a range not less than 0.020 weight % and not more than 0.030 weight %, and thereby the volume resistivity of the conductive fluorine resin material fell in a range more than $1.0 \times 10^3$ Ω·cm and less than $1.0 \times 10^4$ Ω·cm. A value of the volume resistivity is sufficiently lower as compared with a value of a volume resistivity ($10^{18}$ Ω·cm) of a fluorine resin material in which the carbon nanotube is not dispersed.

The present inventors measured a charge voltage generated in the fluid flow passage 113 in a state where an air of 50 kPa was made to flow through the fluid flow passage 113 using the flow rate adjustment apparatus 100 in which the main body 110 had been formed of a conductive fluorine resin material in which the addition amount of the carbon nanotube was set to be 0.025 weight %. The above-described measurement obtained a measurement result in which the charge voltage generating in the fluid flow passage 113 was maintained to be approximately 0.2 kV.

Meanwhile, the inventors measured a charge voltage generated in the fluid flow passage 113 in a state where the air of 50 kPa was made to flow through the fluid flow passage 113 using a flow rate adjustment apparatus of a Comparative Example in which the main body 110 was formed of a fluorine resin material to which the carbon nanotube was not added. The above-described measurement obtained a measurement result in which the charge voltage generating in the fluid flow passage 113 was maintained to be not less than approximately 3.0 kV.

In addition, in a case where the flow rate adjustment apparatus of the Comparative Example was further set to be in a state where the conduction member 140 was not connected to the ground cable 10, a measurement result was obtained in which the charge voltage generating in the fluid flow passage 113 was maintained to be not less than approximately 16.0 kV.

From the above results, in the embodiment, the conductive fluorine resin material that forms the main body 110 of the flow rate adjustment apparatus 100 is set to contain the carbon nanotube at a rate not less than 0.020 weight % and not more than 0.030 weight %. In addition, the main body 110 is set to be connected to the ground cable 10 through the conduction member 140. Hereby, the charge voltage generated in the fluid flow passage 113 can be maintained to be a low value of approximately 0.2 kV.

Figure 4:
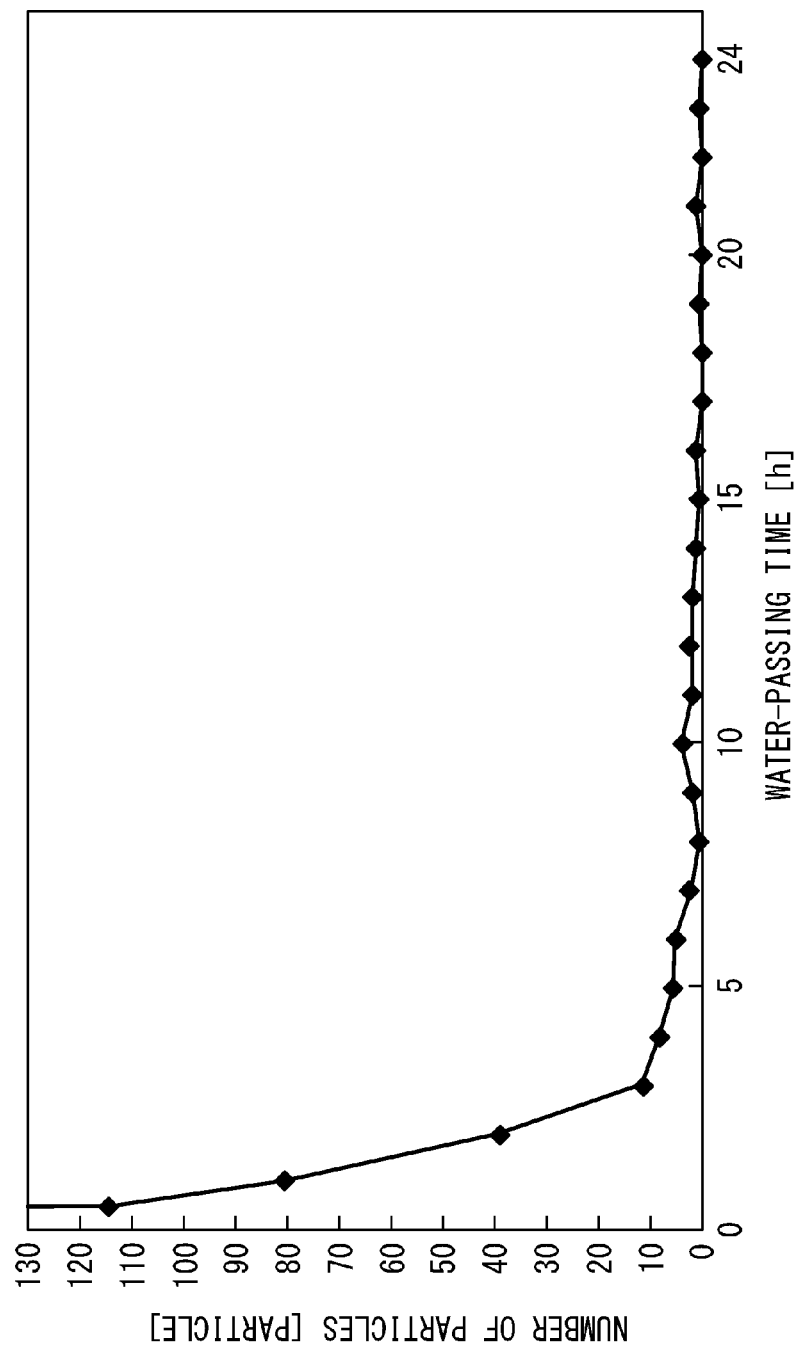
FIG. 4 is a graph showing a relation between a water-passing time and the number of particles.

In addition, the present inventors measured fine particles (particles) contained in the fluid that flowed through the fluid flow passage 113 using the flow rate adjustment apparatus 100 in which the main body 110 had been formed of the conductive fluorine resin material in which the addition amount of the carbon nanotube was set to be 0.025 weight % FIG. 4 is a measurement result showing a relation between a water-passing time for which pure water is made to flow through the fluid flow passage 113 and the number of particles measured by a particle counter (illustration is omitted).

Here, the number of particles means the number of particles each having a size not less than 0.04 µm contained in per 1 ml of pure water.

In addition, in measurement shown in FIG. 4, a flow rate of the pure water that flows through the fluid flow passage 113 was set to be 0.5 liter/m. In addition, at an interval of five seconds, there were switched a blocking state where the valve body part 170 was brought into contact with the valve hole 160a to thereby block the flow of the pure water, and a flowing state where the valve body part 170 was separated from the valve hole 160a to thereby make the pure water flow. In addition, a temperature of the pure water was set to be 25° C.

The number of particles at the time of measurement start (the water-passing time is zero) was approximately 340 although illustration was omitted in FIG. 4. After that, the number of particles gradually decreased along with elapse of the water-passing time, and it was maintained to be not more than ten after elapse of four hours of water-passing time.

As described above, since in the main body 110 of the embodiment, a rate of the carbon nanotube contained in the conductive fluorine resin material is a slight one not more than 0.030 weight %, contamination of the fluid due to contact between the fluid flow passage 113 and the fluid can be suppressed unlike other granular conductive substances, such as carbon black and iron powder.

There will be explained actions and effects exerted by the flow rate adjustment apparatus 100 of the embodiment explained above.

According to the flow rate adjustment apparatus 100 of the embodiment, a rate of the carbon nanotube contained in the conductive fluorine resin material that forms the fluid flow passage 113 directly coming into contact with the fluid is a slight one not less than 0.020 weight % and not more than 0.030 weight %. Even though the rate of the carbon nanotube is the slight one as described above, constant conductivity can be given to the main body 110 to thereby suppress electrostatic charge by dispersing the carbon nanotube not less than 0.020 weight % into the fluorine resin material. This is because a smaller amount of carbon nanotube can give conductivity to the main body 110 as compared with the other granular conductive substances, such as carbon black and iron powder by using as the conductive substance the tubular carbon nanotube having a predetermined length.

In addition, since the rate of the carbon nanotube contained in the conductive fluorine resin material is the slight one not more than 0.030 weight %, contamination of the fluid due to the contact between the fluid flow passage 113 and the fluid can be suppressed unlike the other granular conductive substances, such as carbon black and iron powder.

As described above, according to the flow rate adjustment apparatus 100 of the embodiment, electrostatic charge due to friction between the fluid flow passage 113 and the fluid, and contamination of the fluid due to the contact between the fluid flow passage 113 and the fluid can be suppressed.

The flow rate adjustment apparatus 100 of the embodiment includes the gap (the diameter reduction part) 114 that is arranged in the fluid flow passage 113, and that locally decreases the flow passage cross-sectional area of the fluid flow passage 113.

Therefore, in the flow rate adjustment apparatus 100 including the gap 114 in which electrostatic charge due to friction between the fluid flow passage 113 and the fluid is particularly easily generated, electrostatic charge in the main body 110 adjacent to the gap 114 can be suppressed.

In the flow rate adjustment apparatus 100 of the embodiment, the volume resistivity of the conductive fluorine resin material is more than $1.0 \times 10^3$ Ω·cm and less than $1.0 \times 10^4$ Ω·cm.

By configuring the flow rate adjustment apparatus 100 as described above, the volume resistivity of the conductive fluorine resin material is set to be a value large enough to suppress electrostatic charge due to the friction between the fluid flow passage 113 and the fluid, and electrostatic charge can be suppressed from being generated in the main body 110.

The flow rate adjustment apparatus 100 of the embodiment is attached to the main body 110 in a state of being in contact with it, and includes the metal conduction member 140 that is connectable to the ground cable 10 maintained to have the ground potential.

By configuring the flow rate adjustment apparatus 100 as described above, the conductive fluorine resin material is connected to the ground cable 10 through the conduction member 140 to thereby have a potential close to the ground potential, and electrostatic charge is reliably suppressed from being generated by the friction between the fluid flow passage 113 and the fluid.

The flow rate adjustment apparatus 100 of the embodiment includes: the spring 180 that generates the biasing force in the direction in which the valve body part 170 is brought into contact with the valve hole 160a along the axis line X1 of the valve body part 170; the diaphragm part 190 that is coupled to an end of the valve body part 170 inserted into the valve chamber 160, and has the thin film part 191 annularly formed around the axis line X1; and the pressure chamber 121 that generates an opposing force in a direction in which the valve body part 170 is separated from the valve hole 160a along the axis line X1 of the valve body part 170 through the diaphragm part 190.

By configuring the flow rate adjustment apparatus 100 as described above, in the flow rate adjustment apparatus 100 including the diaphragm part 190 having the thin film part 191 that is particularly easily broken by dielectric breakdown, electrostatic charge is suppressed from being generated by the friction between the fluid flow passage 113 and the fluid, and the thin film part 191 can be prevented from being broken by dielectric breakdown.

In the flow rate adjustment apparatus 100 of the embodiment, the spring 180 is made of metal, and the flow rate adjustment apparatus 100 includes the antistatic member 145 that electrically connects the spring 180 and the main body 110.

By configuring the flow rate adjustment apparatus 100 as described above, since the metal spring 180 is maintained to have the same potential as the main body 110 that is formed of the conductive fluorine resin material, the metal spring 180 can be prevented from being excessively charged to cause dielectric breakdown therearound.

Second Embodiment

Hereinafter, a coupling device 200, which is a second embodiment of the fluidic device according to the present disclosure, will be explained with reference to the drawings. The coupling device 200 of the embodiment is fluidic device that couples a piping through which a fluid (a liquid, such as a chemical liquid and pure water) used for semiconductor manufacturing apparatuses etc. is made to flow.

Figure 5:
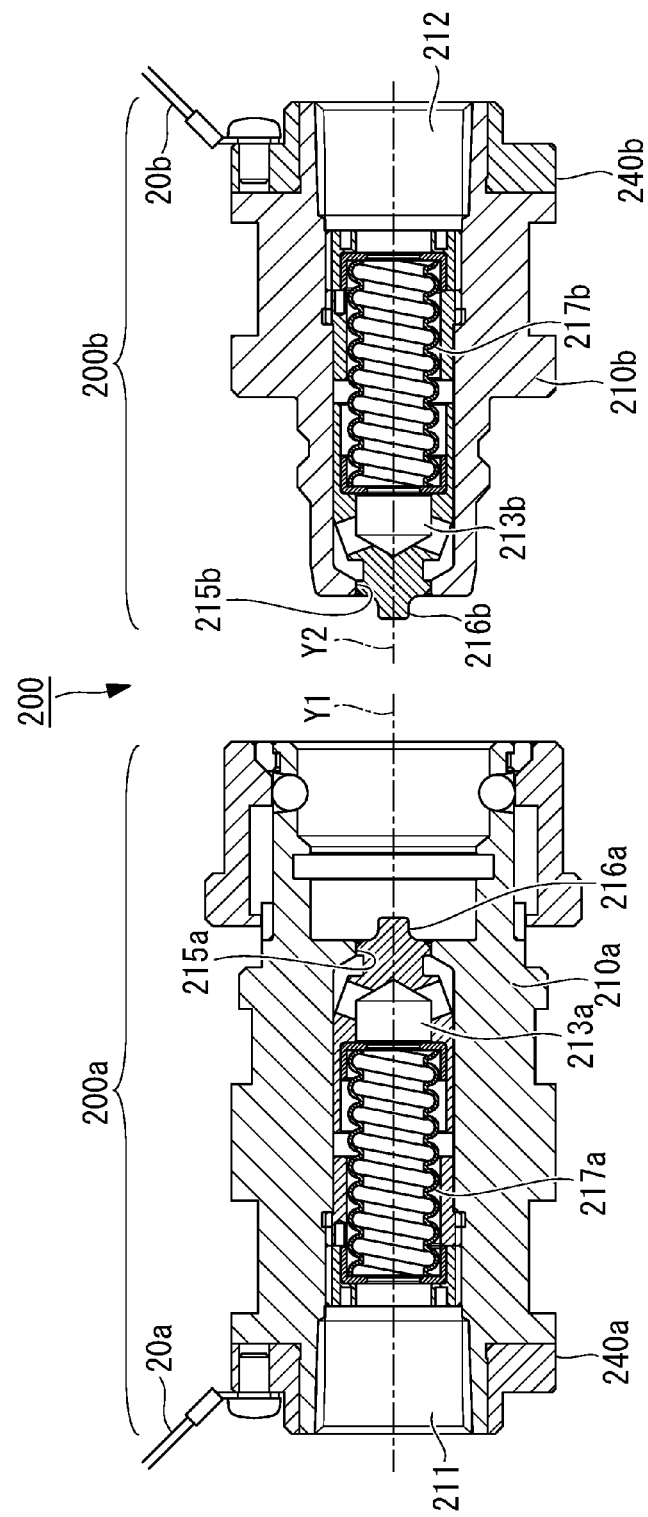
FIG. 5 is a longitudinal cross-sectional view showing one embodiment of a coupling device in a state where a plug device and a socket device are separated from each other.

As shown in FIGS. 5 and 6, the coupling device 200 is the device that includes a socket device 200a and a plug device 200b, and makes the fluid flow from an inflow port 211 to an outflow port 212 by coupling the socket device 200a and the plug device 200b to each other.

Here, the socket device 200a will be explained.

As shown in FIGS. 5 and 6, the socket device 200a includes: a main body (a first main body) 210a; a valve body part (a first valve body part) 216a that is housed in the main body 210a, and is inserted into a valve hole (a first valve hole) 215a; a spring (a first biasing force generation part) 217a that generates a biasing force (a first biasing force) in a direction in which the valve body part 216a is brought into contact with the valve hole 215a; and a conduction member 240a.

The valve hole 215a is the hole that is formed in the main body 210a, and guides to a main body 210b the fluid having flowed in from the inflow port 211.

The main body 210a is a member inside which an upstream-side flow passage 213a that guides the fluid from the inflow port 211 to the valve hole 215a has been formed. The main body 210a is formed of a conductive fluorine resin material containing a fluorine resin material, and a carbon nanotube dispersed in the fluorine resin material.

Here, the conductive fluorine resin material that forms the main body 210a is similar to the conductive fluorine resin material that forms the main body 110 of the first embodiment.

The upstream-side flow passage 213a that is formed inside the main body 210a is communicated with the inflow port 211 and the valve hole 215a to which the fluid is guided from an upstream-side piping (illustration is omitted).

The conduction member 240a is the metal member that is attached to an end of the inflow port 211 side of the main body 210a in a state of being in contact with the main body 210a. The conduction member 240a is connectable to a ground cable 20a maintained to have a ground potential.

The valve body part (the first valve body part) 216a is a member that is formed in a cylindrical shape along an axis line Y1, and that is inserted into the valve hole 215a that guides the fluid from the upstream-side flow passage 213a to a downstream-side flow passage 213b.

The spring 217a is a member made of resin (for example, made of PFA) that is formed in a cylindrical shape whose inside serves as a flow passage of the fluid, and that generates a biasing force in a direction in which the valve body part 216a is brought into contact with the valve hole 215a along the axis line Y1 of the valve body part 216a.

As shown in FIG. 6, in a state where the plug device 200b is coupled to the socket device 200a, a tip of the valve body part 216a of the socket device 200a is in a state of being in contact with a tip of a valve body part 216b of the plug device 200b. In this case, a spring 217b of the plug device 200b generates an opposing force in a direction in which the valve body part 216a is separated from the valve hole 215a along the axis line Y1 of the valve body part 216a.

When the valve body part 216a is separated from the valve hole 215a by the opposing force generated by the spring 217b of the plug device 200b, a gap 214a is formed between the valve hole 215a and the valve body part 216a.

The gap 214a serves as a diameter reduction part that is arranged in the upstream-side flow passage 213a, and that locally decreases a flow passage cross-sectional area of the upstream-side flow passage 213a. Therefore, a flow velocity of the fluid that passes through the gap 214a rises, and the socket device 200a becomes a state where electrostatic charge is easily generated in the main body 210a by friction between the main body 210a near the gap 214a and the fluid.

Next, the plug device 200b will be explained.

As shown in FIGS. 5 and 6, the plug device 200b includes: the main body (a second main body) 210b; the valve body part (a second valve body part) 216b that is housed in the main body 210b, and is inserted into a valve hole (a second valve hole) 215b; the spring (a second biasing force generation part) 217b that generates a biasing force (a second biasing force) in a direction in which the valve body part 216b is brought into contact with the valve hole 215b; and a conduction member 240b.

The valve hole 215b is the hole that is formed in the main body 210b, and guides the fluid made to flow out from the outflow port 212 to the downstream-side flow passage 213b.

The main body 210b is a member inside which the downstream-side flow passage 213b that guides the fluid from the valve hole 215b to the outflow port 212 has been formed. The main body 210b is formed of a conductive fluorine resin material containing a fluorine resin material, and a carbon nanotube dispersed in the fluorine resin material.

Here, the conductive fluorine resin material that forms the main body 210b is similar to the conductive fluorine resin material that forms the main body 110 of the first embodiment.

The downstream-side flow passage 213b that is formed inside the main body 210b is communicated with the outflow port 212 and the valve hole 215b that guide the fluid to a downstream-side piping (illustration is omitted).

The conduction member 240b is the metal member that is attached to an end of the outflow port 212 side of the main body 210b in a state of being in contact with the main body 210b. The conduction member 240b is connectable to a ground cable 20b maintained to have a ground potential.

The valve body part (the second valve body part) 216b is a member that is formed in a cylindrical shape along an axis line Y2, and that is inserted into the valve hole 215b that guides the fluid from the upstream-side flow passage 213a to the downstream-side flow passage 213b.

The spring 217b is a member made of resin (for example, made of PFA) that is formed in a cylindrical shape whose inside serves as a flow passage of the fluid, and that generates a biasing force in a direction in which the valve body part 216b is brought into contact with the valve hole 215b along the axis line Y2 of the valve body part 216b.

As shown in FIG. 6, in a state where the plug device 200b is coupled to the socket device 200a, a tip of the valve body part 216b of the plug device 200b is in a state of being in contact with the tip of the valve body part 216a of the socket device 200a. In this case, the spring 217a of the socket device 200a generates an opposing force in a direction in which the valve body part 216b is separated from the valve hole 215b along the axis line Y2 of the valve body part 216b.

When the valve body part 216b is separated from the valve hole 215b by the opposing force generated by the spring 217a of the socket device 200a, a gap 214b is formed between the valve hole 215b and the valve body part 216b.

The gap 214b serves as a diameter reduction part that is arranged in the downstream-side flow passage 213b, and that locally decreases a flow passage cross-sectional area of the downstream-side flow passage 213b. Therefore, a flow velocity of the fluid that passes through the gap 214b rises, and the plug device 200b becomes a state where electrostatic charge is easily generated in the main body 210b by friction between the main body 210b near the gap 214b and the fluid.

Next, there will be explained the material of which the main body 210a of the socket device 200a and the main body 210b of the plug device 200b are formed.

As mentioned above, the upstream-side flow passage 213a and the downstream-side flow passage 213b are formed inside the main bodies 210a and 210b, and electrostatic charge is easily generated in the main bodies 210a and 210b by friction between the fluid that passes through the upstream-side flow passage 213a and the downstream-side flow passage 213b, and the main bodies 210a and 210b. Particularly, electrostatic charge is remarkably easily generated near the gaps 214a and 214b since the flow velocity of the fluid rises there.

Consequently, in the embodiment, conductivity is given to the main bodies 210a and 210b, and the conduction members 240a and 240b are brought into contact with the main bodies 210a and 210b, whereby electrostatic charge is suppressed from being generated in the main bodies 210a and 210b inside which the upstream-side flow passage 213a and the downstream-side flow passage 213b are formed.

The main bodies 210a and 210b of the embodiment are formed of the conductive fluorine resin material containing the fluorine resin material, and the carbon nanotube dispersed in the fluorine resin material.

Meanwhile, other members excluding the main bodies 210a and 210b and the metal conduction members 240a and 240b are formed of a fluorine resin material into which the carbon nanotube is not dispersed.

Here, the fluorine resin material is, for example, PTFE (polytetrafluoroethylene), PCTFE (polychlorotrifluoroethylene), and PFA (tetrafluoroethylene/perfluoroalkylvinylether copolymer).

In addition, as the carbon nanotube in the embodiment, for example, a carbon nanotube having a length not less than 50 μm is desirably used in order that a small amount of carbon nanotube can give sufficient conductivity.

In the embodiment, the conductive fluorine resin material that forms the main bodies 210a and 210b of the coupling device 200 is set to contain the carbon nanotube at a rate not less than 0.020 weight % and not more than 0.030 weight %. In addition, the main bodies 210a and 210b are set to be connected to the ground cables 20a and 20b through the conduction members 240a and 240b. Hereby, similarly to the first embodiment, charge voltages generated in the upstream-side flow passage 213a and the downstream-side flow passage 213b can be maintained to be a low value of approximately 0.2 kV.

In addition, a point is similar to the first embodiment in which the number of particles contained in the fluid that flows through the upstream-side flow passage 213a and the downstream-side flow passage 213b is sufficiently reduced, and in which there can be suppressed contamination of the fluid due to contact between the upstream-side flow passage 213a and the downstream-side flow passage 213b, and the fluid.

According to the embodiment, in the coupling device 200 that couples the main body (the first main body) 210a and the main body (the second main body) 210b, and makes the fluid flow from the upstream-side flow passage 213a of the main body 210a to the downstream-side flow passage 213b of the main body 210b, electrostatic charge is suppressed from being generated by the friction between the upstream-side flow passage 213a and the fluid near the gap (the first gap) 214a that is formed between the valve hole (the first valve hole) 215a and the valve body part (the first valve body part) 216a. Similarly, electrostatic charge is suppressed from being generated by the friction between the downstream-side flow passage 213b and the fluid near the gap (the second gap) 214b that is formed between the valve hole (the second valve hole) 215b and the valve body part (the second valve body part) 216b.

The invention claimed is:

1. A fluidic device that is installed in a piping through which a fluid used for a semiconductor manufacturing apparatus is made to flow, the fluidic device comprising:
    a main body inside which a fluid flow passage that guides a fluid has been formed,
    wherein the main body is formed of a conductive fluorine resin material containing a fluorine resin material, and a carbon nanotube dispersed in the fluorine resin material, and
    wherein a volume resistivity of the conductive fluorine resin material is more than $1.0 \times 10^3$ Ω·cm and less than $1.0 \times 10^4$ Ω·cm.

2. The fluidic device according to claim 1, further comprising a diameter reduction part that is arranged in the fluid flow passage, and locally decreases a flow passage cross-sectional area of the fluid flow passage.

3. The fluidic device according to claim 1, further comprising a metal conduction member that is attached in a state of being in contact with the main body, and is connectable to a ground cable maintained to have a ground potential.

4. The fluidic device according to claim 1, wherein the conductive fluorine resin material contains the carbon nanotube at a rate not less than 0.020 weight % and not more than 0.030 weight %.

5. The fluidic device according to claim 4, wherein the fluid flow passage has:
    an upstream-side flow passage that is communicated with an inflow port; and
    a downstream-side flow passage that is communicated with an outflow port,
    wherein the fluidic device further comprises: a valve chamber that is communicated with the upstream-side flow passage and the downstream-side flow passage; and a valve body part that is inserted into a valve hole that guides the fluid from the upstream-side flow passage to the valve chamber, and
    wherein the diameter reduction part is a gap that is formed between the valve hole and the valve body part.

6. The fluidic device according to claim 5, further comprising:
    a biasing force generation part that generates a biasing force in a direction in which the valve body part is brought into contact with the valve hole along an axis line of the valve body part;
    a diaphragm part that is coupled to an end of the valve body part inserted into the valve chamber, and has a thin film part annularly formed around the axis line; and
    an opposing force generation part that generates an opposing force in a direction in which the valve body part is separated from the valve hole along the axis line of the valve body part through the diaphragm part.

7. The fluidic device according to claim 6, wherein the biasing force generation part is a metal spring, and
    wherein the fluidic device further comprises an antistatic member that electrically connects the spring and the main body.

8. The fluidic device according to claim 4, wherein the fluid flow passage has: an upstream-side flow passage that is communicated with an inflow port; and a downstream-side flow passage that is communicated with an outflow port,
    wherein the main body has: a first main body inside which the upstream-side flow passage has been formed; and a second main body inside which the downstream-side flow passage has been formed,
    wherein the fluidic device further comprises:
        a first valve hole that is formed in the first main body, and guides to the second main body the fluid having flowed in from the inflow port;
        a first valve body part that is housed in the first main body, and is inserted into the first valve hole;
        a first biasing force generation part that generates a first biasing force in a direction in which the first valve body part is brought into contact with the first valve hole along a first axis line of the first valve body part;
        a second valve hole that is formed in the second main body, and guides to the downstream-side flow passage the fluid made to flow out from the outflow port;
        a second valve body part that is housed in the second main body, and is inserted into the second valve hole; and
        a second biasing force generation part that generates a second biasing force in a direction in which the second valve body part is brought into contact with the second valve hole along a second axis line of the second valve body part, and wherein the diameter reduction parts are a first gap that is formed between the first valve hole and the first valve body part, and a second gap that is formed between the second valve hole and the second valve body part.

9. A fluidic device, the fluidic device comprising:

a main body inside which a fluid flow passage that guides a fluid has been formed, wherein the main body is formed of a conductive fluorine resin material containing a fluorine resin material, and a carbon nanotube dispersed in the fluorine resin material, wherein a volume resistivity of the conductive fluorine resin material is more than $1.0 \times 10^3$ Ω·cm and less than $1.0 \times 10^4$·Ω·cm, and wherein the fluidic device is configured to be installed in a piping through which a fluid used for a semiconductor manufacturing apparatus is made to flow.

10. A system, comprising:

a semiconductor manufacturing apparatus;

a piping through which a fluid for the semiconductor manufacturing apparatus flows; and a fluidic device installed in the piping, the fluidic device comprising:

a main body inside which a fluid flow passage that guides a fluid has been formed, wherein the main body is formed of a conductive fluorine resin material containing a fluorine resin material, and a carbon nanotube dispersed in the fluorine resin material, and wherein a volume resistivity of the conductive fluorine resin material is more than $1.0 \times 10^3$ Ω·cm and less than $1.0 \leq 10^4$·Ω·cm.

* * * * *